(12) United States Patent
Hagh et al.

(10) Patent No.: US 7,346,833 B2
(45) Date of Patent: Mar. 18, 2008

(54) REDUCED COMPLEXITY TURBO DECODING SCHEME

(75) Inventors: Mohamadreza Marandian Hagh, Belmont, MA (US); Zoran Zvonar, Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 708 days.

(21) Appl. No.: 10/625,485

(22) Filed: Jul. 23, 2003

(65) Prior Publication Data

US 2004/0148556 A1    Jul. 29, 2004

Related U.S. Application Data

(60) Provisional application No. 60/423,778, filed on Nov. 5, 2002.

(51) Int. Cl.
*H03M 13/45* (2006.01)

(52) U.S. Cl. ............................ 714/780; 714/794

(58) Field of Classification Search ............ 714/755, 714/794, 780
See application file for complete search history.

(56) References Cited

U.S. PATENT DOCUMENTS

| | | | |
|---|---|---|---|
| 5,181,209 A | 1/1993 | Hagenauer et al. ........... 371/43 |
| 5,406,570 A | 4/1995 | Berrou et al. ................. 371/43 |
| 5,446,747 A | 8/1995 | Berrou ......................... 371/45 |
| 5,537,444 A | 7/1996 | Nill et al. .................... 375/341 |
| 5,563,897 A | 10/1996 | Pyndiah et al. ............. 371/37.4 |
| 5,629,884 A * | 5/1997 | Pan et al. .................... 708/517 |
| 5,721,745 A | 2/1998 | Hladik et al. ................. 371/43 |
| 5,721,746 A | 2/1998 | Hladik et al. ................. 371/43 |
| 5,729,560 A | 3/1998 | Hagenauer et al. ........ 371/43.1 |
| 5,734,962 A | 3/1998 | Hladik et al. .............. 371/137.4 |
| 5,761,248 A | 6/1998 | Hagenauer et al. ......... 375/340 |
| 6,182,100 B1 * | 1/2001 | Schmookler ................ 708/277 |
| 6,192,084 B1 * | 2/2001 | Miyauchi et al. ........... 375/262 |
| 6,343,368 B1 * | 1/2002 | Lerzer ........................ 714/796 |
| 6,658,071 B1 * | 12/2003 | Cheng ........................ 375/348 |
| 6,718,504 B1 * | 4/2004 | Coombs et al. ............ 714/755 |
| 6,772,389 B2 * | 8/2004 | Kim et al. .................. 714/780 |
| 6,798,366 B1 * | 9/2004 | Widdup ...................... 341/106 |
| 6,807,238 B1 * | 10/2004 | Rhee et al. ................. 375/340 |

OTHER PUBLICATIONS

M. Hagh "Design of Turbo Coded Modulation for Bandwidth Limited Channels," M.S. thesis, University of Tehran, Mar. 1999.
3G TS 25.212 V3.1.0 (1999-21) http://www.3gpp.org; 3$^{rd}$ Generation Partnership Project: Technical Specification Group Radio Access Network; Multiplexing and channel coding (FDD), Dec. 12, 1999.
C. Berrou, A. Glavieux, and P. Thitimajshima "Near Shannon Limited Error-Correcting Coding and Decoding Turbo-Codes (1)," Proc. ICC' 93, May 1993, Geneva, Switzerland, pp. 1064-1070.

(Continued)

*Primary Examiner*—Stephen M. Baker
(74) *Attorney, Agent, or Firm*—Bromberg & Sunstein LLP

(57) ABSTRACT

A reduced complexity turbo decoding scheme combines elements from two MAP (Maximum a posteriori) algorithms, namely a LogMAP algorithm and a max-LogMAP algorithm. Forward and backward recursive metrics are computed in accordance with the max-LogMAP algorithm, while output extrinsic LLR (Log Likelihood Ratio) values are computed in accordance with the LogMAP algorithm.

17 Claims, 9 Drawing Sheets

OTHER PUBLICATIONS

L.F. Choy, I.J. Fair, W.A. Krzymien "Complexity-Performance Trade-offs in Turbo Codes for IMT-2000," in Proc. 2000 IEEE Vehicular Technology Conference, Boston, MA, USA, pp. 4.6.2.4.

D. Divsalar and F. Pollara "Multiple Turbo Codes for Deep-Space Communications," *The JPL TDA Progress Report* 42-121, Jan.-Mar. 1995, May 15, 1995.

S. Bendetto, D. Divsalar, G. Montorsi, F. Pollara "A Soft-Input Soft-Output APP Module for Iterative Decoding of Concatenated Codes," IEEE Communication Letters, Jan. 1997.

F. Khaleghi, A. Khandani, N. Secord, A. Gutierrez "On Symbol-based Turbo Codes for cdma2000," Wireless Communications and Networking Conference, 1999. WCNC. 1999 IEEE, vol. 1, 1999 pp. 471-745.

H. Michel, A. Worm, N. Wehn "Influence of Quantization on the Bit-Error Performance of Turbo-Decoders," In Proc. 2000 IEEE Vehicular Technology Conference, Tokyo, Japan, pp. 581-585.

Dr. Jason P. Woodard "Implementation of High Rate Turbo Decoders for Third Generation Mobile Communications," IEEE Colloquium on Turbo Codes in Digital Broadcasting, 1999, pp. 12.1-12.6.

A. Worm, P. Hoeher, N. Wehn "Turbo-Decoding Without SNR Estimation," IEEE Communication Letter, vol. 4, No. 6, Jun. 2000.

A.J. Richardson "Performance of WCDMA Turbo Code Decoders-Part 1," Imagicom Technical Report TR01-001, Sep. 20, 1999.

M. Marandian, J. Fridman, Z. Zvonar, M. Salehi "Performance Analysis of Sliding Window Turbo Decoding Algorithms for 3GPP FDD Mode," International Journal of Wireless Information Networks, vol. 9, No. 1, Jan. 2002.

P. Robertson "Improving Decoder and Code Structure of Parallel Concatenated Recursive Systematic (Turbo) Codes," IEEE, Sessions 1.8 & 1.9, Apr. 1994.

3G TS 25.212 V3.2.0 (Mar. 2000) http://www.3gpp.org; 3$^{rd}$ Generation Partnership Project: Technical Specification Group Radio Access Network; Multiplexing and channel coding (FDD), (Release 1999).

* cited by examiner

REDUCED COMPLEXITY TURBO DECODING SCHEME

PRIORITY

This patent application claims priority from U.S. Provisional Patent Application No. 60/423,778 filed Nov. 5, 2002, which is hereby incorporated herein by reference in its entirety.

FIELD OF THE INVENTION

The present invention relates generally to error correction coding, and more particularly to a reduced complexity turbo decoding scheme.

BACKGROUND OF THE INVENTION

The following references are all hereby incorporated herein by reference in their entireties, and are referenced throughout the specification using the reference in brackets:

[3G212] 3G TS25.212 V3.1.1 (1999-12), http://www.3gpp.org

[Ber93] C. Berrou, A. Glavieux, and P. Thitimajshima, "Near Shannon limit error-correcting coding and decoding": Turbo codes (1), "in Proc. ICC" 93, May 1993., Geneva, Switzerland, pp 1064-1070.

[Ber95] U.S. Pat. No. 5,446,747 entitled "Error-Correction Coding Method With at Least Two Systematic Convolutional Codings in Parallel, Corresponding Iterative Decoding Method, Decoding Module and Decoder," issued on Aug. 29, 1995 in the name of Claude Berrou.

[Cho00] L. F. Choy, I. J. Fair, W. A. Krzymien, "Complexity-Performance Trade-offs in Turbo Codes for IMT-2000", , in Proc. 2000 IEEE Vehicular Technology Conference, Boston, USA, pp 4.6.2.4

[Div95] D. Divsalar and F. Pollara, "Multiple Turbo Codes for Deep-Space Communications", *The JPL TDA Progress Report* 42-121, January-March 1995, May 15, 1995.

[Div96A] S. Benedetto, D. Divsalar, G. Montorsi, and F. Pollara, "A Soft-Input Soft-Output APP Module for Iterative Decoding of Concatenated Codes", IEEE Communications Letters, January, 1997

[Kha99] Khaleghi, F.; Khandani, A.; Secord, N.; Gutierrez, A. "On symbol-based turbo codes for cdma2000". Wireless Communications and Networking Conference, 1999. WCNC. 1999 IEEE, 1999 Page(s): 471-475 vol.1

[MiC00] H. Michel, A. Worn, and Nobert Wehn, "Influence of Quantization on the Bit-Error Performance of Turbo-Decoders,", In Proc. 2000 IEEE Vehicular Technology Conference, Tokyo, Japan, pp 581-585.

[Moh99] Mohamadreza Marandian Hagh, "Design of turbo coded modulations for bandwidth limited channels", M.S. thesis, University of Tehran, March 1999.

[Moh02] Mohamadreza Marandian Hagh, Jose Fridman, Zoran Zvonar and Masoud Salehi, "Performance Analysis of Sliding Window Turbo Decoding Algorithms for 3GPP FDD Mode", International Journal of Wireless Information Networks, IJWIN, January 2002, pages 39-54.

[Ric99] A. J. Richardson, "Performance of WCDMA Turbo Code Decoders—Part 1", *Imagicom Technical Report* TR01-001. Sep. 20th, 1999.

[Rob95] Patrick Robertson, "Improving Decoder and Code Structure of Parallel Concatenated Recursive Systematic (Turbo) Codes", 1994, *Third Annual International Conference on Universal Personal Communications*, San Diego, USA, pp 183-187.

[Woo99] Jason P. Woodard, "Implementation of High Rate Turbo Decoders for Third Generation Mobile Communications", IEE Colloquium on Turbo Codes in Digital Broadcasting, 1999, pp 12.1-12.6.

[Wor00] Alexander Worm, Peter Hoeher, and Norbert Wehn, "Turbo-Decoding without SNR Estimation ", *IEEE Communication Letter*, Vol. 4, No. 6, June 2000.

The turbo coding (TC) scheme [Ber95] has been considered for many advanced communication systems. For example, turbo coding has been specified as the channel coding technique for high date rate traffic channels in Third Generation Partnership Project (3GPP) wireless Code Division Multiple Access (CDMA) systems. The 3GPP TC scheme uses two Recursive Systematic Convolutional (RSC) codes in parallel with an interleaver in between them. FIG. 1 shows the structure of a standard 3GPP TC encoder.

In order to increase turbo code performance, encoder termination is applied on both RSC encoders individually. Trellis termination makes the encoder return to state zero after all data bits are transmitted. This allows beginning and ending states to be known at the receiver. Furthermore, both systematic and parity bits in each RSC encoder in the termination procedure are sent through the channel. This means that no puncturing applies on the systematic bits of the second RSC encoder at termination time. The coding rate of the turbo code in 3GPP standard is R=1/3 and, considering there are three bits of memory in each RSC encoder in the turbo code encoder, there are eight states per constituent encoder. The transfer function of each 8 state constituent encoder of turbo code is:

$$G(D) = \left[1, \frac{1+D+D^3}{1+D^2+D^3}\right] \quad (1)$$

Taking the tail bits from the shift register feedback after all information bits are encoded performs trellis termination. Tail bits are added after the encoding of information bits.

The first three tail bits are used to terminate the first constituent encoder while the second constituent encoder is disabled. The last three tail bits are used to terminate the second constituent encoder while the first constituent encoder is disabled. Also, it is practical to use the termination information of the two RSC encoders in an iteration stopping algorithm in the receiver.

FIG. 2 shows a trellis diagram for each RSC constituent encoder. This trellis consists of eight states. The state labels correspond to input values of the encoder memory from left to right, for example, $S_3=(110)$ corresponds to input with equivalent polynomial $1+1\times D+0\times D^2$.

The interleaver length for the turbo code encoder is a function of the input data length. Since the input data length in 3GPP standard varies from 40 to 5114 bits discontinuously, the interleaver length must change in the same range. It is known that the performance of an iterative turbo code decoder strongly depends on the interleaver structures. From an implementation point of view, it is impractical to find a good interleaver pattern for each input data length and store the various interleaver patterns in the memory at the receiver. Typically, an algorithm that generates "almost good" interleaver patterns for every input data length is used. In 3GPP, a prime number sequence generator is used for this purpose. More details can be found in [3G212].

The turbo code decoder uses an iterative decoding technique. FIG. 3 shows a general block diagram of an iterative turbo code decoder. Iterative decoding is a low complexity sub-optimum decoding strategy that approaches the performance of an optimum maximum likelihood (ML) decoding algorithm in high signal to noise ratios. The optimum ML decoding for turbo codes requires a huge hyper-trellis with a large number of states that takes into account all memories in the two constituent encoders and the internal interleaver [Div96]. It is known that number of states in ML algorithms is an exponential function of total number of memories in the encoder. For example in 3GPP system, and for a received block with length N=100, optimal ML decoder requires a trellis with $2^{106}$ states!

Simulations of turbo decoders in the Third Generation Partnership Project (3GPP) applications have shown that the performance of the overall system is closely related to the performance of the decoder, particularly for small frame sizes. A typical turbo decoder is based on an iterative structure constructed from MAP (Maximum a posteriori) SISO (soft input soft output) decoders as basic building blocks. The MAP algorithm is one of the oldest SISO decoding algorithms for soft decoding of block codes. Since the introduction of turbo codes, many other SISO decoding algorithms have been introduced for serial, parallel, and hybrid concatenation detection systems [Div96].

The LogMAP algorithm is a log domain version of the MAP algorithm that is less complex than the MAP algorithm. The LogMAP algorithm (as well as the MAP algorithm) is not well-suited for implementation on any Digital Signal Processor (DSP), particularly because it requires many non-linear operations including exponential and logarithm operations.

The max-LogMAP algorithm is a low complexity version of the LogMAP algorithm. It uses an approximation and is appropriate for hardware and DSP implementation. Unfortunately, the max-LogMAP algorithm does not perform as well as the LogMAP algorithm. Simulations have shown a performance degradation of about 0.4-0.6 dB in turbo code decoders using the max-LogMAP algorithm as compared to the LogMAP algorithm.

SUMMARY OF THE INVENTION

Various embodiments of the present invention provide an iterative decoding method, an iterative decoder, an apparatus having two interconnected decoders, and a decoding program for decoding received digital data elements representing source data elements coded according to a turbo coding scheme. Decoding the received digital data elements involves computing a set of branch metrics for the received digital data elements based upon at least one received digital data element; computing a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k};$$

computing a set of backward recursive metrics based upon the set of branch metrics according to an approximation:

$$B_k(m') = \log[\beta_k(m')] = \max_{m}\{\Gamma(u_k, c_k, m', m) + B_{k+1}(m)\} - H_{B_k};$$

and computing a set of output extrinsic Log Likelihood Ratio (LLR) values based upon the set of backward metrics and the set of forward metrics according to an equation:

$$\Lambda(d_k) = \sum_{i=0}^{1}\left\{(-1)^{i+1}\log\left[\sum_{e:u(e)=i} e^{\{A_{k-1}(m')+\Gamma_i(c_k,m'm)+B_k(m)\}}\right]\right\} - H_\Delta. \quad (2)$$

Decoding may involve the use of a table of logarithm values to determine the value $$L(i) = \log\left[\sum_{e:u(e)=i} e^{\{A_{k-1}(m')+\Gamma_i(c_k,m',m)+B_k(m)\}}\right]$$

where $\Gamma_i(c_k,m',m)$ is the branch metric for the branch which connects state m' to state m and i and $c_k$ are the branch labels for input data and coded bits respectively.

The value $L(d_k=i)$ may be obtained directly from the table or may be derived from information in the table, for example, by obtaining the values above and below the value $L(d_k=i)$ and extrapolating the value $L(d_k=i)$.

Computing the set of backward recursive metrics may involve the use of a sliding window for processing less than the entirety of received digital data elements. The sliding window may initialize the set of backward recursive metrics with equal probabilities, or may initialize the set of backward recursive metrics with the set of forward recursive metrics.

DETAILED DESCRIPTION OF A PREFERRED EMBODIMENT

Figure 1:
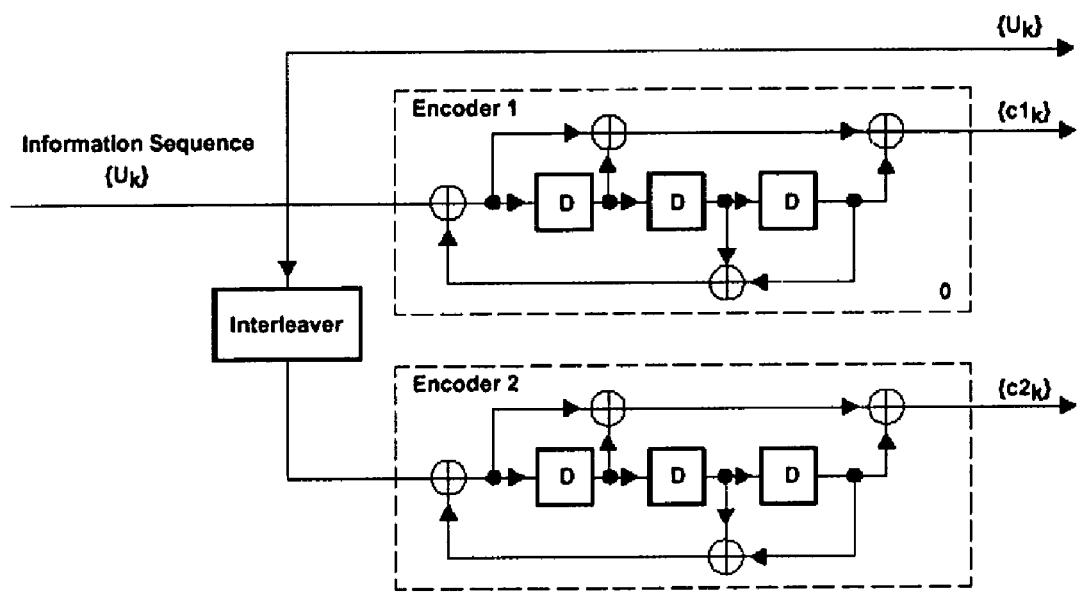
FIG. 1 shows the structure of a standard 3GPP TC encoder.
Figure 2:
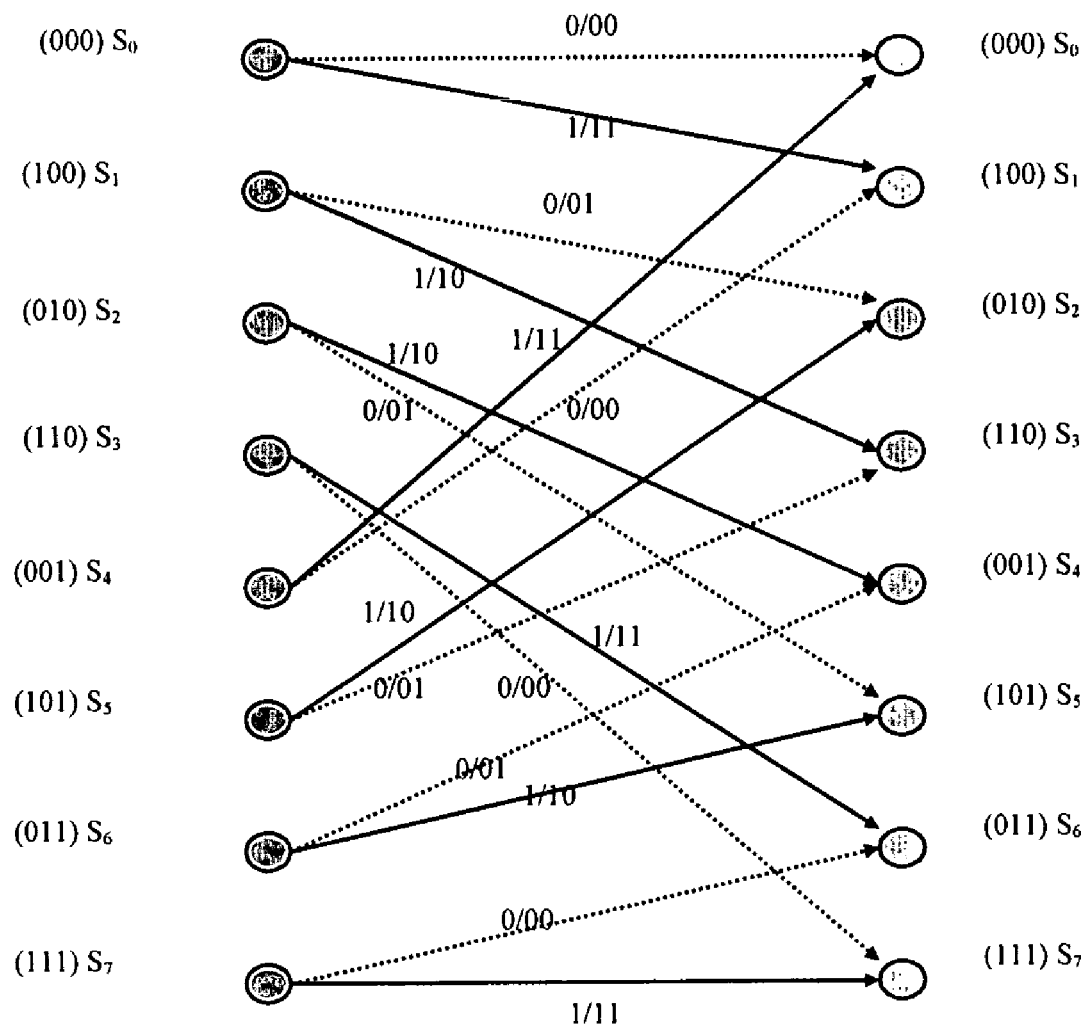
FIG. 2 shows a trellis diagram for each RSC constituent encoder.

An embodiment of the present invention employs a novel SISO decoding algorithm that is essentially a combination of the LogMAP algorithm and the max-LogMAP algorithm. For convenience, the SISO decoding algorithm of the present invention is referred to hereinafter as the semi-LogMAP algorithm. The semi-LogMAP algorithm is substantially less complex than the LogMAP algorithm, and performance for small frame sizes is fairly close to that of the LogMAP algorithm. Simulation results have shown that the performance difference between the semi-LogMAP algorithm and the LogMAP algorithm in most cases is less than 0.05 dB. The semi-LogMAP algorithm can be used in a fixed-point implementation of a turbo code decoder for a 3GPP wireless CDMA system.

LogMAP

The LogMAP algorithm is Log domain version of the MAP algorithm. A complete derivation of the LogMAP algorithm is not presented herein. However, the derivations necessary to pass information between the decoders is presented.

There is no degradation in bit error rate (BER) performance by using LogMAP in instead of the MAP. In fact, using the LogMAP algorithm helps to reduce the overall complexity of the SISO decoder module.

From this point forward, the LogMAP notation will be used to represent an optimum SISO decoding algorithm. The notation applies to the first decoder in the concatenated scheme, and the second decoder can be treated in the same way. In the original MAP algorithm the perfect channel information is required. The LogMAP algorithm is presented in such a way that this information is available for receiver, although there are sub-optimum versions of the LogMAP algorithm in which the estimation of the channel noise is not necessary. In these versions of the LogMAP an estimation of the noise variance can be obtained from received sequence [Rob95].

Consider a binary communication system that uses BPSK modulation in additive white Gaussian noise environment. The goal of the LogMAP algorithm is to provide an algorithm of the ratio of the a posteriori probability (APP) of each information bit $d_k$ being 1 to the APP of it being 0:

$$\Lambda(d_k) = \log \frac{Pr\{d_k = 1|\underline{u}, \underline{c}\}}{Pr\{d_k = 0|\underline{u}, \underline{c}\}} \quad (3)$$

In this equation, $\Lambda(d_k)$ is called Log Likelihood Ratio, LLR, which will be used hereinafter. Let $S_k$ represents the state of the encoder at time k. If M is the number of memories in each constituent encoder, $S_k$ can take on values between 0 and $2^{M-1}$. The bit $d_k$ is associated with the transition from step k−1 to step k. In a derivation similar to [Ber93] we obtain:

$$\Lambda(d_k) = \log \frac{\sum_m \sum_{m'} \gamma_1(u_k, c_k, m', m) \cdot \alpha_{k-1}(m') \cdot \beta_k(m)}{\sum_m \sum_{m'} \gamma_0(u_k, c_k, m', m) \cdot \alpha_{k-1}(m') \cdot \beta_k(m)} \quad (4)$$

where $\alpha_k(m')$ is called forward recursion metric of the LogMAP algorithm, and can be expressed in a simple recursive fashion:

$$\alpha_k(m) = \frac{\sum_{m'} \sum_{i=0}^{1} \gamma_i(u_k, c_k, m', m) \cdot \alpha_{k-1}(m')}{\sum_m \sum_{m'} \sum_{i=0}^{1} \gamma_i(u_k, c_k, m', m) \cdot \alpha_{k-1}(m')} \quad (5)$$

Similarly, the $\beta_k(m)$, which is called backward recursion metric, can be expressed as:

$$\beta_k(m) = \frac{\sum_{m'} \sum_{i=0}^{1} \gamma_i(u_{k+1}, c_{k+1}, m', m) \cdot \beta_{k+1}(m')}{\sum_m \sum_{m'} \sum_{i=0}^{1} \gamma_i(u_{k+1}, c_{k+1}, m', m) \cdot \beta_{k+1}(m')} \quad (6)$$

The branch transition probability is given by[Ber93]:

$$\gamma_i(u_k, c_k, m', m) = p(u_k|d_k=i, S_k=m, S_{k-1}=m') \cdot p(c_k|d_k=i, S_k=m, S_{k-1}=m') \cdot q(d_k=i|S_k=m, S_{k-1}=m) \cdot P_r(S_k=m|S_{k-1}=m') \quad (7)$$

where $q(d_k=i|S_k=m, S_{k-1}=m')$ is either zero or one depending on whether bit i is associated with the transition from state m' to state m. It is in the last component that the information of the previous decoder is used: the probability $P_r(S_k=m|S_{k-1}=m')$ depends directly on a-priori probability of the information bit $d_k$. We use the a-priori probability of the bit $d_k$ given us by the previous decoder in:

$$P_r(S_k = m|S_{k-1} = m') = \frac{e^{L(d_k)}}{1 + e^{L(d_k)}} \quad (8)$$

if $q(d_k = 1|S_k = m, S_{k-1} = m') = 1$; and $$P_r(S_k = m|S_{k-1} = m') = 1 - \frac{e^{L(d_k)}}{1 + e^{L(d_k)}} = \frac{1}{1 + e^{L(d_k)}} \quad (9)$$

if $q(d_k=0|S_k m, S_{k-1}=m')=1$;

The term $L(d_k)$ is the extrinsic component of the LLR that the other decoder has provided for the information bit $d_k$. It is used as a priori information in the current decoder. In an iterative decoder, we must ensure that the 'a priori' information is independent of the other information (observation) being used in the decoder. We can write the LogMAP output for bit $d_k$ as:

$$\Lambda(d_k) = \log \frac{\sum_m \sum_{m'} \gamma_1(c_k, m', m) \cdot \alpha_{k-1}(m') \cdot \beta_k(m)}{\sum_m \sum_{m'} \gamma_0(c_k, m', m) \cdot \alpha_{k-1}(m') \cdot \beta_k(m)} + \log\left(\frac{\frac{e^{L(d_k)}}{1+e^{L(d_k)}}}{\frac{1}{1+e^{L(d_k)}}}\right) + \log\left(\frac{p(u_k|d_k = 1)}{p(u_k|d_k = 0)}\right) \quad (10)$$

The second component in this equation is the a-priori term, $L(d_k)$ generated by the previous decoder, and the last components is the systematic term. The first component is the extrinsic component and is independent of the a-priori and systematic information for the bit $d_k$. The computational complexity, however, is high compared to other sub-optimal algorithm like the Soft Output Viterbi Algorithm (SOVA). This is mainly due to the fact that this is a multiplicative algorithm. This drawback is overcome by the full additive version of the MAP SISO algorithm [Div96A]:

$$\log[\alpha_k(m)] = \log\left[\sum_{e:s^E(e)=m} e^{[\Gamma(u_k,c_k,m',m)+\log(\alpha_{k-1}(m'))]}\right] - H_{\alpha_k} \quad (11)$$

$$\log[\beta_k(m)] = \log\left[\sum_{e:s^E(e)=m} e^{\Gamma\{(u_k,c_k,m',m)+\log(\beta_{k+1}(m'))\}}\right] - H_{\beta_k} \quad (12)$$

and for output LLR we have:

$$\Lambda(d_k) = \sum_{i=0}^{l}\left\{(-1)^{i+1}\log\left[\sum_{e:u(e)=i} e^{[\log(\alpha_{k-1}(m'))+\Gamma_i(c_k,m',m)+\log(\beta_k(m))]}\right]\right\} + \\ \log\left(\frac{\frac{e^{L(d_k)}}{1+e^{L(d_k)}}}{\frac{1}{1+e^{L(d_k)}}}\right) + \log\left(\frac{p(u_k \mid d_k=1)}{p(u_k \mid d_k=0)}\right) - H_\Delta$$

(13)

where $H_{\alpha_k}, H_\beta$ and $H_\Delta$ are normalization values for forward metric, backward metric and output LLR respectively in log domain and initial values in case of termination of both RSC constituent encoder for path recursive metrics are:

$$\log[\alpha_0(m')] = \begin{cases} 0 & m' = 0 \\ -\infty & \text{otherwise} \end{cases}$$

$$\log[\beta_N(m)] = \begin{cases} 0 & m = 0 \\ -\infty & \text{otherwise} \end{cases}$$

where N is the data block length. The general procedure to perform this algorithm starts with calculation of branch metrics, $\gamma_i(u_k,c_k,m',m)$, for all stages. Then, using initial values and recursive equation for forward and backward metrics, $\alpha_i(m')$ and $\beta_i(m)$ can be calculated. The last step involves computation of output LLR and extrinsic information.

One problem with previous recursions involves the evaluation of the logarithm of a sum of exponential functions like:

$$a = \log\left[\sum_{i}^{l} \exp\{a_i\}\right] \quad (14)$$

To evaluate a in this equation, it can be approximated with [Div96A]:

$$a = \log\left[\sum_{i}^{L} \exp\{a_i\}\right] \cong \max_{i}^{L}\{a_i\} = a_M \quad (15)$$

To get more accurate results, this function also can be replaced by:

$$a = \log\left[\sum_{i}^{2} \exp\{a_i\}\right] \cong \log[1 + \exp(-|a_1 - a_2|)] \quad (16)$$

This approximation still requires exponential and logarithm operations, which are non-linear and hard to implement in DSP based systems.

Max-LogMAP

The max-LogMAP algorithm is a low complexity version of the LogMAP algorithm, which uses the approximation given in (14) and it is very straightforward to implement on DSP. The LogMAP algorithm is roughly three times more complex than the max-LogMAP algorithm. With regards to the approximation used, the final recursion equations change to:

$$A_k(m) = \log[\alpha_k(m)] = \max_{m'}\{\Gamma(u_k,c_k,m',m) + A_{k-1}(m')\} - H_{A_k} \quad (17)$$

$$B_k(m') = \log[\beta_k(m')] = \max_{m}\{\Gamma(u_k,c_k,m',m) + B_{k+1}(m)\} - H_{B_k} \quad (18)$$

and for output LLR we get:

$$\Lambda = (d_k) \\ = \sum_{i=0}^{1}\left\{(-1)^{i+1}\max_{e:u(e)=i}[A_{k-1}(m') + \\ \Gamma_i(c_k,m',m) + B_k(m)]\right\} + L(d_k) + L_{sys}.$$

(19)

where $L(d_k)$ and $L_{sys}$ represent the a-priori probability from previous iteration and the systematic term of output LLR value respectively. Also the branch metrics are defined as:

$$\Gamma_i(u_k,c_k,m',m) = \log(\gamma_i(u_k,c_k,m',m)) \quad (20)$$

$$\Gamma_i(c_k,m',m) = \log(\gamma_i(c_k,m',m)) \quad (21)$$

An important problem with implementation of the Log-MAP algorithm is that it requires perfect SNR information of input data sequence to the SISO decoder. This significantly increases the complexity of the LogMAP decoder, which is one reason why this algorithm is not convenient for DSP implementation. Any error in SNR estimation directly affects performance of the LogMAP decoder.

In regards to estimating the precise SNR in the input of decoder, finite precision or fixed-point implementation becomes an important issue. The consequence of finite precision appears on channel SNR estimation offset, and that is a reason for degradation in overall performance. Also it is known that an accurate variance estimation (which is a part of SNR estimation) requires a long data sequence.

Figure 10:
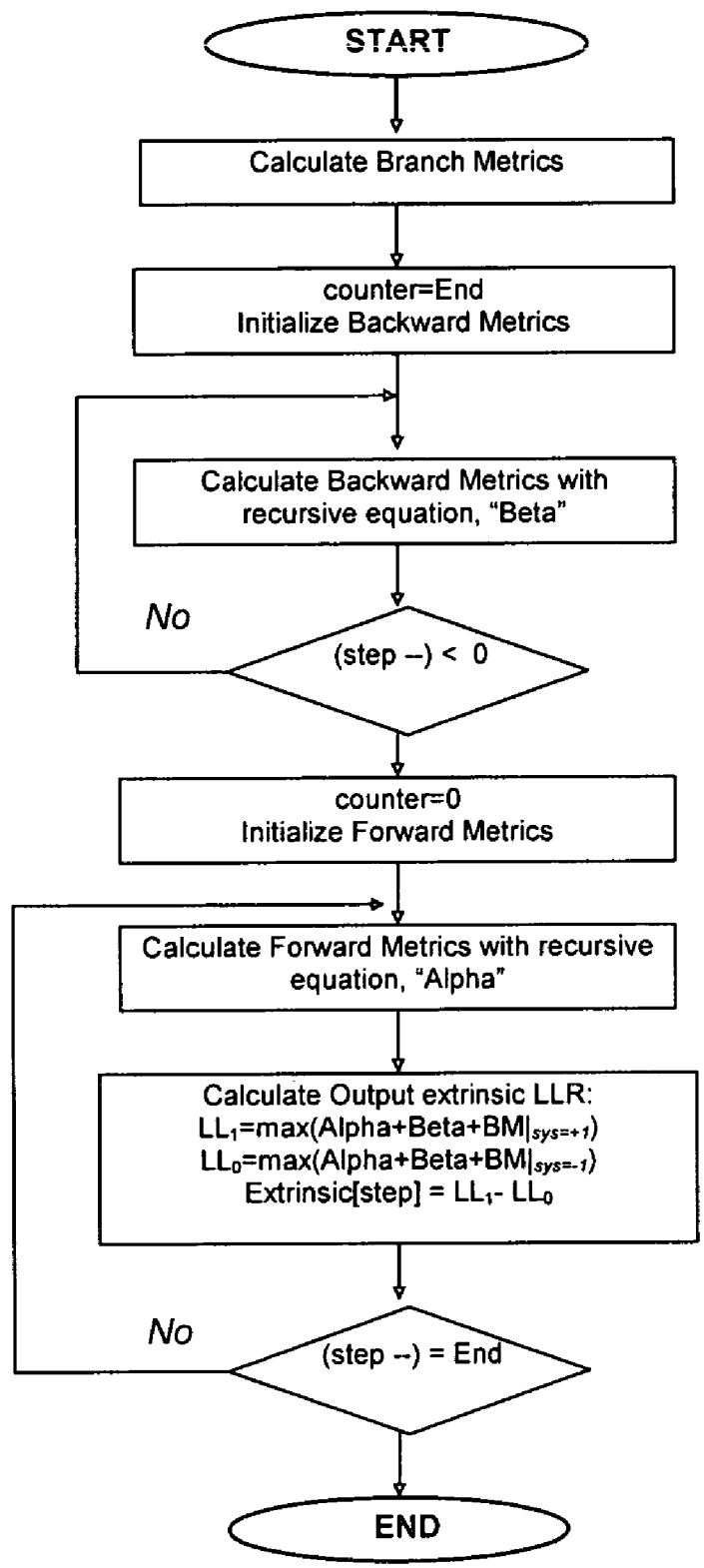
FIG. 10 is a logic flow diagram that describes the max-LogMAP algorithm.

FIG. 10 is a flow chart that describes the max-LogMAP algorithm, while other MAP variants have similar logic flows. It should be noted that this flow chart is for one SISO decoding module, not for a whole turbo decoding routine. Beginning in block 1202, branch metrics are calculated in block 1204. Then, backward metrics are initialized for the end of the frame, in block 1206, and then the backward metrics are calculated using a recursive strategy in an iterative loop involving blocks 1208 and 1210. Each MAP variant uses a different type of approximation, so the recursive algorithm is different for each MAP variant, but the overall procedure is same. After backward metrics are calculated, the forward metrics are initialized for the start of the frame, in block 1212, and then the forward metrics are calculated in an iterative loop involving blocks 1214, 1216, and 1218. During calculation of forward metrics in block 1214, all required information for calculating the output LLR values or extrinsic information is obtained. Therefore, calculation of the output values is done inside the forward metric loop, in block 1216. This is possible because the forward metrics are not maintained, which reduced the amount of memory required and also improves DSP performance by reducing the number of memory accesses. The logic ends in block 1299.

Simulation results show around 0.4 dB degradation in performance using the max-LogMAP algorithm in the same number of iterations for an AWGN channel with interleaver length N=1280. It is possible to decrease this degradation in performance by applying a few more iterations when the received block is relatively long enough. This is because there is a remarkable iteration gain for large interleaver sizes and with one or two more iterations, the decoder still can achieve a better performance.

Simulation results also show a variable degradation in performance in terms of frame size when the max-LogMAP algorithm is used. In an iterative decoding scheme, one of the important effects of using the max-LogMAP algorithm is that total iteration gain decreases. This effect, which can be seen clearly in large interleaver sizes, is due to a decrease in the quality of soft LLR values that are passed between two SISO decoders in every iteration. After a few initial iterations, the iterative decoder is not able to converge to a better result.

On the other hand, the overall performance of the decoder is a function of input frame size or interleaver size. This is a very important issue to consider when developing a reliable iterative decoding strategy based on frame size to achieve good performance with limited available memory and acceptable overall complexity.

The overall performance of the system depends mainly on the performance of the TC decoder for small frame sizes (roughly smaller than 100).

SEMI-LogMAP

The semi-LogMAP algorithm is a combination of the LogMAP algorithm and the max-LogMAP algorithm. The performance of the semi-LogMAP algorithm for small block sizes is fairly close to the LogMAP algorithm In terms of complexity, the semi-LogMAP algorithm uses $2^{(M+1)}$ max operations for forward and backward path metrics and, for output extrinsic LLRs similar to the LogMAP algorithm, it uses a table for accurate MAP approximation:

$$a = \log\left[\sum_{i}^{2} \exp\{a_i\}\right] \cong \log[1 + \exp(-|a_1 - a_2|)]$$

In the semi-LogMAP algorithm, forward and backward metrics can be expressed by:

$$A_k(m) = \log[\alpha_k(m)] = \max_{m'}\{\Gamma(u_k, c_k, m', m) + A_{k-1}(m')\} - H_{A_k} \quad (23)$$

$$B_k(m') = \log[\beta_k(m')] = \max_{m}\{\Gamma(u_k, c_k, m', m) + B_{k+1}(m)\} - H_{B_k} \quad (24)$$

and output extrinsic LLR values are calculated as:

$$\Lambda(d_k) = \sum_{i=0}^{1}\left\{(-1)^{i+1}\log\left[\sum_{e:u(e)=i} e^{\{A_{k-1}(m')+\Gamma(c_k,m',m)+B_k(m)\}}\right]\right\} - H_\Delta \quad (25)$$

Figure 11:
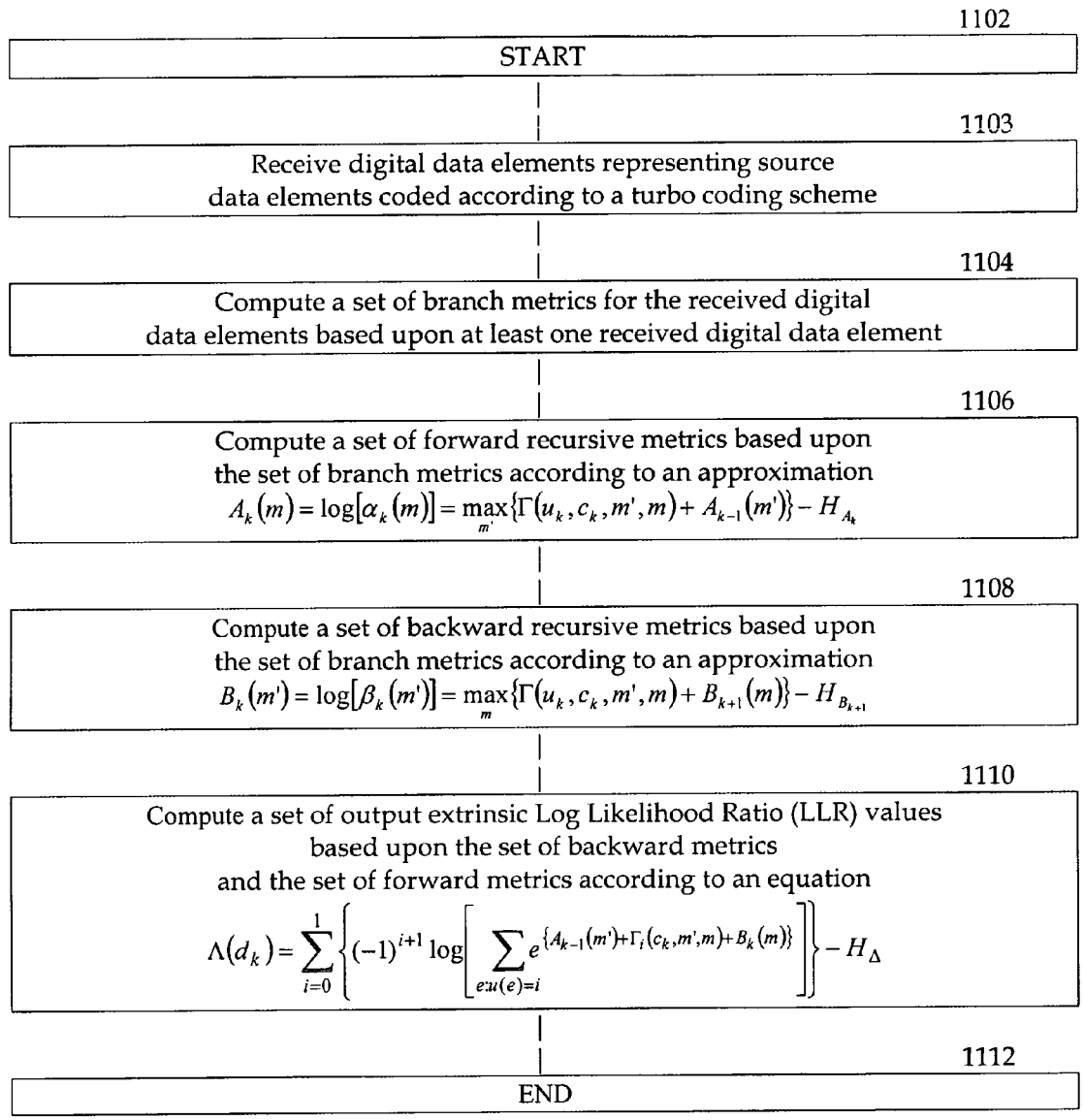
FIG. 11 is a logic flow diagram showing exemplary logic 1100 for and iterative decoding method for decoding received digital data elements representing source data elements coded according to a turbo coding scheme in accordance with an embodiment of the present invention.

FIG. 11 is a logic flow diagram showing exemplary logic 1100 for an iterative decoding method for decoding received digital data elements representing source data elements coded according to a turbo coding scheme in accordance with an embodiment of the present invention. Specifically, starting in block 1102, the logic receives digital data elements representing source data elements coded according to a turbo coding scheme, in block 1103. The logic computes a set of branch metrics for the received digital data elements based upon at least one received digital data element, in block 1104. In block 1106, the logic computes a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k}.$$

In block 1108, the logic computes a set of backward recursive metrics based upon the set of branch metrics according to an approximation:

$$B_k(m')=\log[\beta_k(m')]=\max_m\{\Gamma(u_k,c_k,m',m)+B_{k+1}(m)\}-H_{B_k}.$$

In block 1110, the logic computes a set of output extrinsic Log Likelihood Ratio (LLR) values based upon the set of backward metrics and the set of forward metrics according to an equation:

$$\Lambda(d_k) = \sum_{i=0}^{1}\left\{(-1)^{i+1}\log\left[\sum_{e:u(e)=i} e^{\{A_{k-1}(m')+\Gamma_i(c_k,m',m)+B_k(m)\}}\right]\right\} - H_\Delta.$$

The logic 1100 ends in block 1112.

In an exemplary embodiment of the invention, logarithm values are stored in a table. Once the value within brackets is computed, the table is used to determine the logarithm of the value within the brackets. If the value within the brackets falls between two values in the table, then the logarithm may be estimated by extrapolating from the logarithms of the two closest values. Once the logarithm is determined, the remainder of the calculation is performed.

This method helps to increase the quality of extrinsic LLR values in small frame lengths, and it still has a low complexity in comparison to the LogMAP algorithm.

Figure 4:
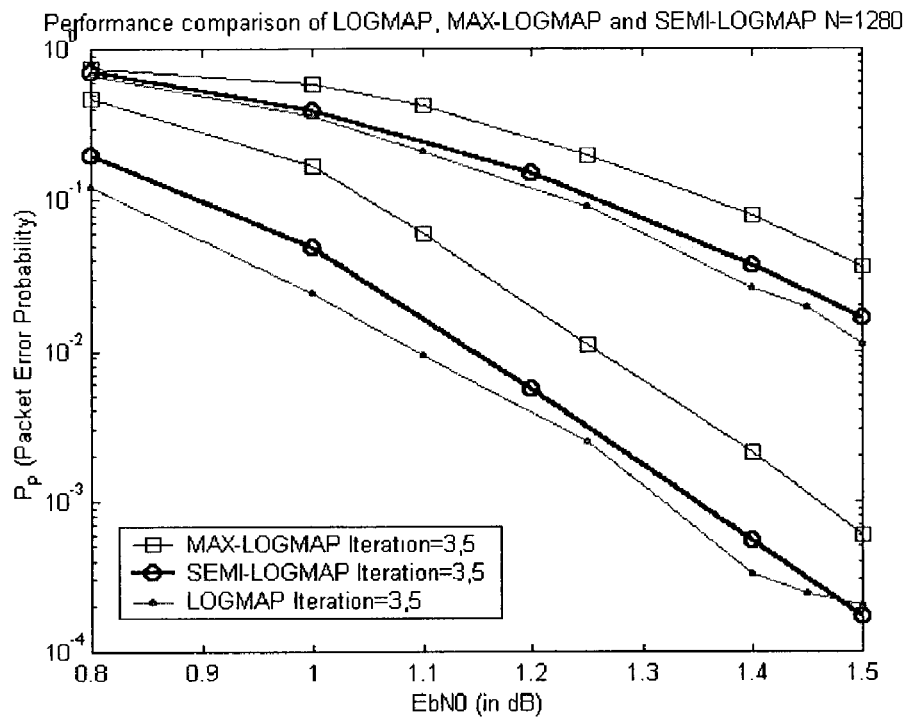
FIG. 4 shows simulation results for frame error rate for the semi-LogMAP algorithm, the LogMAP algorithm, and the max-LogMAP algorithm for different frame sizes.

FIG. 4 shows simulation results for frame error rate for the semi-LogMAP algorithm, the LogMAP algorithm, and the max-LogMAP algorithm for different frame sizes.

Figure 5:
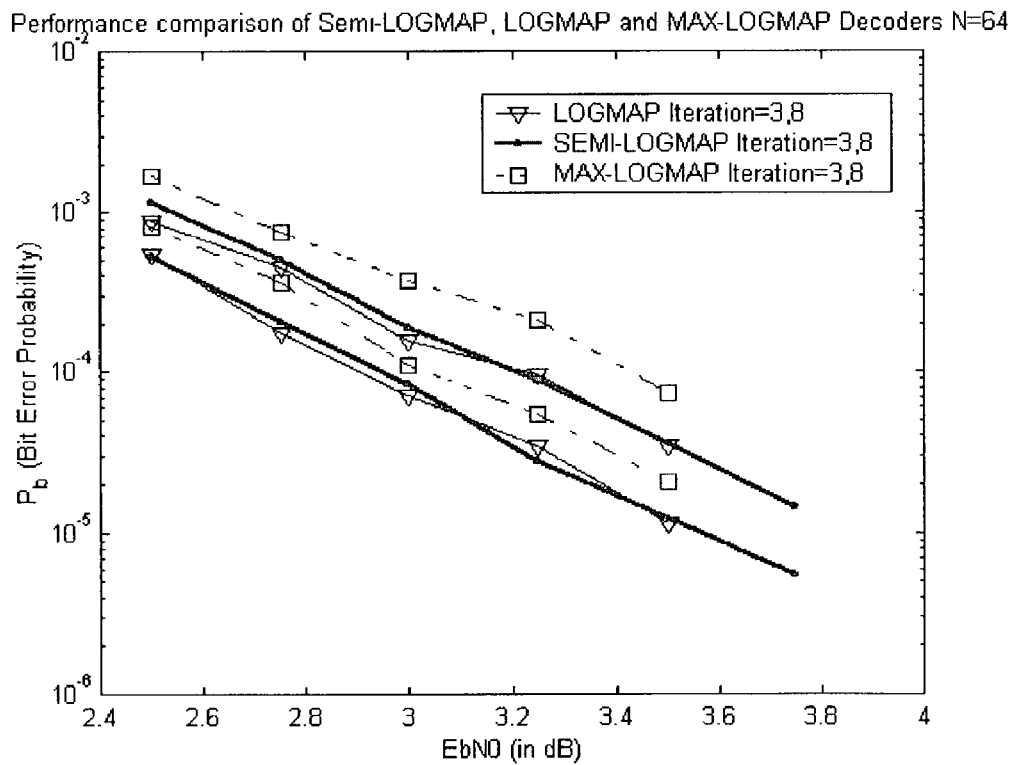
FIG. 5 shows simulation results for bit error rate for the semi-LogMAP algorithm, the LogMAP algorithm, and the max-LogMAP algorithm for different frame sizes.

FIG. 5 shows simulation results for bit error rate for the semi-LogMAP algorithm, the LogMAP algorithm, and the max-LogMAP algorithm for different frame sizes.

The semi-LogMAP algorithm can be a good candidate for hardware implementation of SISO decoder modules with different applications in serial and parallel decoding modules.

In general, a desired decoder would be a decoder that has low delay and low complexity for large frame sizes and performs very close to performance of the optimum decoder for small frame sizes, since the performance of the overall system strongly depends on the performance of the decoder for small frame sizes.

Serial and Parallel Turbo Decoders

Figure 3:
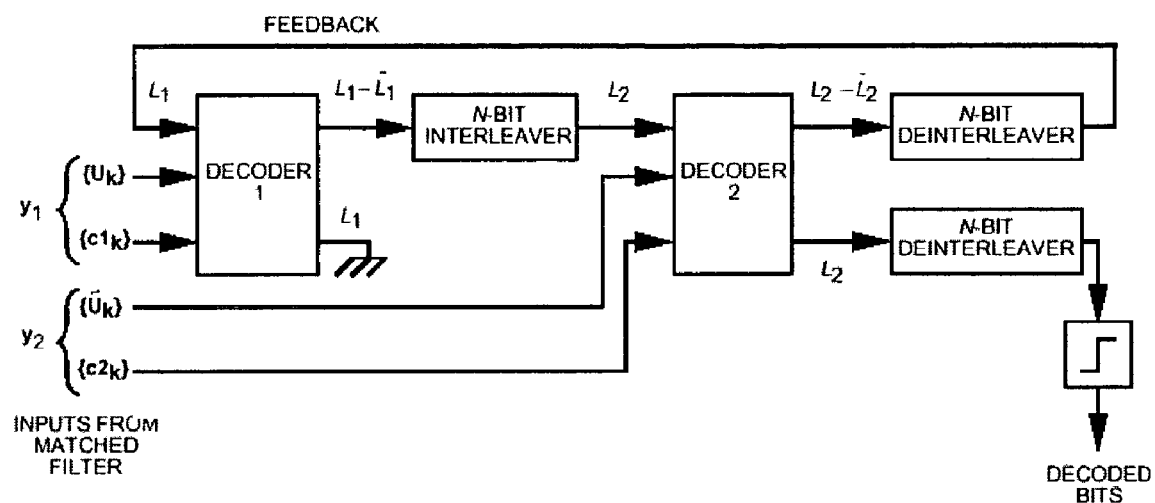
FIG. 3 shows a general block diagram of an iterative turbo code decoder.
Figure 6:
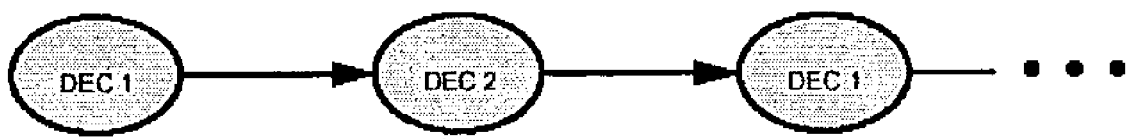
FIG. 6 shows the structure of a serial iterative decoder with two constituent decoders (DEC 1 and DEC 2)

In the serial structure, the first SISO decoder runs with no APP information and generates extrinsic information for the next decoder. The second SISO decoder receives the extrinsic information for systematic bits and modifies this information using the second sequence of parities. FIG. 6 shows the structure of the serial iterative decoder with two SISO decoders (DEC 1 and DEC 2) and FIG. 3 also illustrates the turbo decoder with details of the serial structure.

Figure 7:
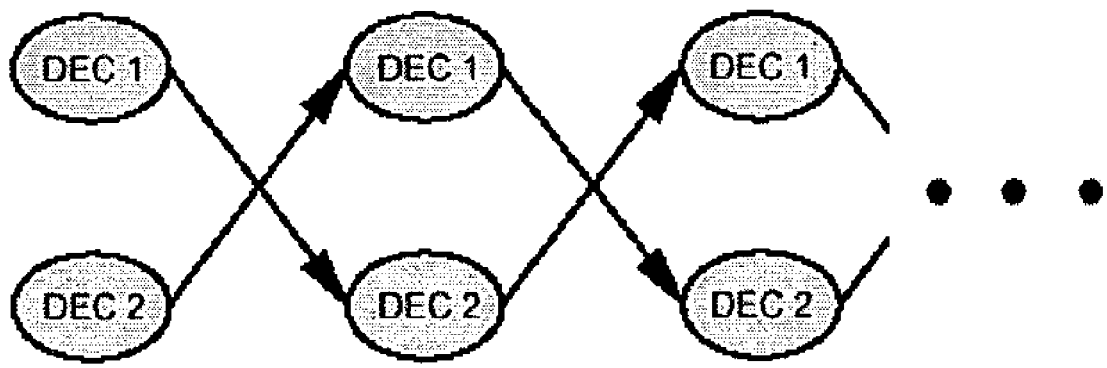
FIG. 7 shows the structure of a parallel iterative decoder with two constituent decoders (DEC 1 and DEC 2)

In a parallel structure, two SISO decoders start with no APP information and generate extrinsic information for the next decoder simultaneously. At each stage, the decoders exchange extrinsic information, and each decoder modifies the extrinsic information based upon its own systematic and parity bits. This operation runs many times in iteration loops. FIG. 7 shows the structure of a parallel iterative decoder with two constituent decoders (DEC 1 and DEC 2).

The basic idea behind the parallel structure is to reduce the decoding delay using maximum available parallel resources in hardware. The parallel structure is not well-suited to a DSP implementation, because the DSP is inherently serial in nature. Therefore, there are no significant benefits in terms of computation delay, execution time, and memory by using parallel structures in a DSP implementation.

From an implementation point of view, the serial decoder structure needs less control overhead and has fewer stalls and interferences in access to memory. It is therefore preferable to use the serial decoder structure for a 3GPP TC decoder implemented on a DSP platform.

Iteration Stopping Algorithm

One of the biggest advantages of using turbo codes is dynamic complexity or dynamic iterations. In conventional block codes and convolutional codes, the complexity of the decoder is fixed and does not change with channel characteristics. In turbo codes, the complexity of the whole decoder can be a function of channel SNR. In a DSP implementation, complexity can be characterized by the number of required cycles, memory size, and memory access frequency. In turbo codes, there is a trade off between BER performance and complexity, and it is possible to improve the performance using higher iteration numbers and therefore higher complexity.

In a DSP implementation of turbo codes, it is desirable to control the complexity and delay of the decoder by avoiding any extra iterations that are not necessary. This can be done with different "iteration stopping" algorithms. The idea behind these algorithms is try to estimate the status of the decoder in current iteration and try to find out whether or not there is any error in the output data in the current iteration.

As a simple iteration stopping algorithm, one may use the hard output values of the second SISO decoder to terminate the first RSC encoder. This algorithm determines whether or not the output sequence is a valid codeword.

In higher signal to noise ratios, correct decoding can be accomplished with fewer iterations. Hence, decoding complexity is lower than before. On the other hand, for large block sizes, iteration gain is significant and therefore, in lower signal to noise ratios, better performance may be obtained with more iterations. This is why the average and maximum required iterations increase for this case. When small block sizes are used, iteration may not be that helpful, and the average required iteration is close to the minimum required iterations. This is because turbo codes are inherently block codes and when a short block has been corrupted in the channel with a powerful noise, the decoder cannot recover the correct data even with more iterations. However when the received block is in good condition, only a few iterations are needed to decode the data.

There are many different known iteration stopping algorithm such as:
  Soft Output Variance Estimation
  Cross Entropy
  CRC
  Sign Change Ratio (Hard Value compare)
  Termination check The semi-log MAP SISO decoder is the building block of a low complexity turbo decoder, where other building blocks (iteration stopping, interleavers) as well as serial and parallel approach can be applied based on underlying the semi-log MAP principle.

Memory Efficient Algorithms

As discussed above, turbo decoders require a large amount of memory for storage of the branch metric values, the interleaver pattern array, the input and output LLR of the SISO decoders, and the backward metric, and for temporary storage of the forward metric values and other variables. One problem for DSP implementations of turbo decoders is that the amount of memory required for the turbo decoder typically exceeds the amount of fast on-chip memory on the DSP. The memory efficient algorithms are therefore required for hardware and DSP implementations of turbo decoders.

Sliding Windowing Algorithms

The sliding window algorithm can be used to reduce the decoder memory requirements. The sliding window algorithms are sub-optimal memory efficient algorithms. In these algorithms, in order to calculate backward metrics, similar to the Viterbi algorithm, a sliding window is used instead of looking at the entirety of received information in a frame. There are essentially two types of windowing algorithms. In a first type of windowing algorithm, the backward metrics are initialized with equal probability values because there is no information about future signal observation. In the second type of windowing algorithm, the backward metrics are initialized with forward metrics, which are estimations for the path metrics based on a previous observation [Div96A].

Windowing Algorithm 1

In order to minimize the performance degradation in the turbo decoder, a guard or tail window is used. This window helps backward metrics to become close to their real values (i.e., their values when no windowing is used). Depending on the depth of the guard window, degradation in performance and errors in backward metrics may vary. A longer guard window gives a better performance than a short window. On the other hand, tail window makes partial computational overhead for the decoder, because the guard window has to be repeated for each sliding window, and so computational increases [Moh02].

Figure 8:
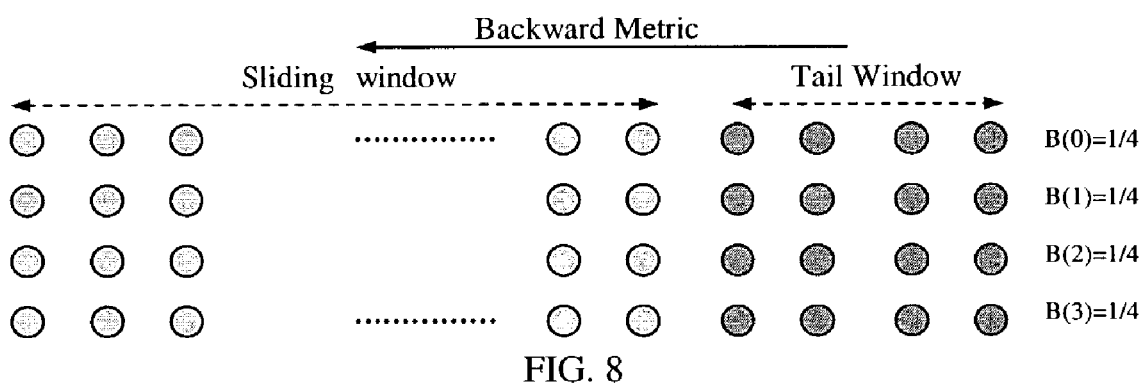
FIG. 8 illustrates an example for sliding window algorithm with two sliding and tail windows for a 4-states trellis.

Similar to other optimization problems in turbo decoder, the depth of the sliding and the guard windows are important to apply a trade off between complexity and performance. FIG. 8 illustrates an example for the sliding window algorithm using sliding and tail windows. Using the sliding window algorithm causes degradation in performance of the turbo decoder at the same number of iterations, especially for large interleaver sizes. However, in large block sizes, there is a significant iteration gain, which helps to compensate for the windowing algorithm. This makes it possible to overcome the performance degradation with higher number of iterations.

Windowing Algorithm 2

Figure 9:
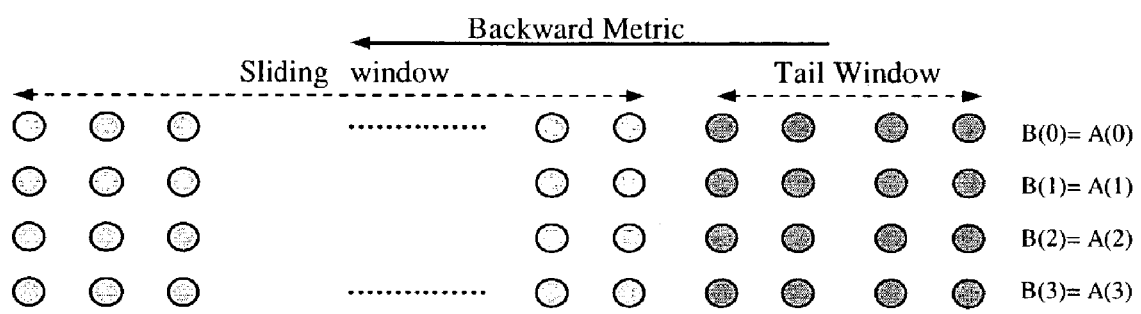
FIG. 9 shows the structure of the second windowing algorithm.

As discussed above, in the first algorithm, backward metrics can be initialized with equal probabilities, because there is no information from future signal observation in the windowing algorithm, but in the second scenario, backward metrics can be initialized with forward metrics, which are estimation for path metrics based on previous observation. FIG. 9 shows the structure of the second windowing algorithm [Moh02].

An important point of performance analysis is that the effect of using sliding window algorithm appears on the frame error-rates as well, which are the main performance criteria for turbo codes. Basically, turbo codes are considered as block codes and since no other serial outer concatenated code is used in 3GPP systems to recover any errors at the output of the turbo decoder, frame error rate is the major performance criteria.

The degradation in overall performance of the TC decoder depends on the accuracy of the backward metric values at the end of the tail window, and the complexity overhead depends on the ratio of tail window length to sliding window length. The total required memory size depends on the length of the tail window plus sliding window, which is desired to be small. The Performance comparison of two windowing algorithms shows that in high signal to noise ratios, the first algorithm achieves a slightly better performance in both bit and frame error rates. In both algorithms, the guard window size is an important parameter that strongly affects the overall performance of the system. However, a long guard window size may slightly increase complexity of the decoder, although this increase in complexity is negligible. In general, the first algorithm seems to be more convenient for DSP implementation in 3GPP systems [Moh02]. According to available memory size in most DSPs and considering FER performance and complexity overhead, W=100 and WT=10 appear to be good choices. When W=100 is chosen for the turbo decoder in 3GPP standard, 1600 bytes of memory for backward metric values are required. Also, the sliding window algorithm must applied at least for interleaver sizes larger than N=150. W=128 is an appropriate choice for fixed-point implementations.

It should be noted that the logic flow diagram is used herein to demonstrate various aspects of the invention, and should not be construed to limit the present invention to any particular logic flow or logic implementation. The described logic may be partitioned into different logic blocks (e.g., programs, modules, functions, or subroutines) without changing the overall results or otherwise departing from the true scope of the invention. Often times, logic elements may be added, modified, omitted, performed in a different order, or implemented using different logic constructs (e.g., logic gates, looping primitives, conditional logic, and other logic constructs) without changing the overall results or otherwise departing from the true scope of the invention.

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies (e.g., Bluetooth), networking technologies, and internetworking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

The present invention may be embodied in other specific forms without departing from the true scope of the invention. The described embodiments are to be considered in all respects only as illustrative and not restrictive.

What is claimed is:

1. In an iterative decoder, an iterative decoding method for decoding received digital data elements representing source data elements coded according to a turbo coding scheme, the iterative decoding method comprising:
   computing a set of branch metrics for the received digital data elements based upon at least one received digital data element;
   computing a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k};$$

computing a set of backward recursive metrics based upon the set of branch metrics according to an approximation:

$$B_k(m') = \log[\beta_k(m')] = \max_{m}\{\Gamma(u_k, c_k, m', m) + B_{k+1}(m)\} - H_{B_k}; \text{ and}$$

computing a set of output extrinsic Log Likelihood Ratio (LLR) values based upon the set of backward metrics and the set of forward metrics according to an equation:

$$\Lambda(d_k) = \log\left[\sum_{e:u(e)=d_k=+1} e^{\{A_{k-1}(m')+\Gamma_1(c_k,m',m)+B_k(m)\}}\right] -$$
   $$\log\left[\sum_{e:u(e)=d_k=0} e^{\{A_{k-1}(m')+\Gamma_0(c_k,m',m)+B_k(m)\}}\right];$$

and
   outputting the set of output extrinsic Log Likelihood Ratio (LLR) values.

2. The iterative decoding method of claim 1, wherein computing the set of backward recursive metrics comprises:
   using a sliding window for processing less than the entirety of received digital data elements.

3. The iterative decoding method of claim 2, wherein using a sliding window for processing less than the entirety of received digital data elements comprises:
   initializing the set of backward recursive metrics with equal probabilities.

4. The iterative decoding method of claim 2, wherein using a sliding window for processing less than the entirety of received digital data elements comprises:
   initializing the set of backward recursive metrics with the set of forward recursive metrics.

5. Apparatus for decoding received digital data elements representing source data elements coded according to a turbo coding scheme, the apparatus comprising:
   branch metric logic operably coupled to compute a set of branch metrics for the received digital data elements based upon at least one received digital data element;
   forward recursive metric logic operably coupled to compute a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k};$$

backward recursive metric logic operably coupled to compute a set of backward recursive metrics based upon the set of branch metrics according to an approximation:

$$B_k(m') = \log[\beta_k(m')] = \max_{m}\{\Gamma(u_k, c_k, m', m) + B_{k+1}(m)\} - H_{B_k};$$

extrinsic logic operably coupled to compute a set of output extrinsic Log Likelihood Ratio (LLR) values based upon the set of backward metrics and the set of forward metrics according to an equation:

$$\Lambda(d_k) = \log\left[\sum_{e:u(e)=d_k=+1} e^{\{A_{k-1}(m')+\Gamma_1(c_k,m',m)+B_k(m)\}}\right] -$$
   $$\log\left[\sum_{e:u(e)=d_k=0} e^{\{A_{k-1}(m')+\Gamma_0(c_k,m',m)+B_k(m)\}}\right];$$

and
   output logic operably coupled to output the set of output extrinsic Log Likelihood Ratio (LLR) values.

6. Apparatus according to claim 5, wherein the backward recursive metric logic comprises:
   logic for using a sliding window for processing less than the entirety of received digital data elements.

7. Apparatus according to claim 6, wherein the logic for using a sliding window for processing less than the entirety of received digital data elements comprises:
   logic for initializing the set of backward recursive metrics with equal probabilities.

8. Apparatus according to claim 6, wherein the logic for using a sliding window for processing less than the entirety of received digital data elements comprises:
   logic for initializing the set of backward recursive metrics with the set of forward recursive metrics.

9. An apparatus for decoding received digital data elements representing source data elements coded according to a turbo coding scheme, the apparatus comprising:
   a first iterative decoder;
   a second iterative decoder;
   an interleaver operably coupled to receive first output extrinsic Log Likelihood Ratio (LLR) values from the first iterative decoder and to provide interleaved output extrinsic Log Likelihood Ratio (LLR) values to the second iterative decoder; and
   a deinterleaver operably coupled to receive second output extrinsic Log Likelihood Ratio (LLR) values from the second iterative decoder and to provide deinterleaved output extrinsic Log Likelihood Ratio (LLR) values to the first iterative decoder, wherein each iterative decoder comprises:
   branch metric logic operably coupled to compute a set of branch metrics for the received digital data elements based upon at least one received digital data element;

forward recursive metric logic operably coupled to compute a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k};$$

backward recursive metric logic operably coupled to compute a set of backward recursive metrics based upon the set of branch metrics according to an approximation:

$$B_k(m') = \log[\beta_k(m')] = \max_{m}\{\Gamma(u_k, c_k, m', m) + B_{k+1}(m)\} - H_{B_k};$$

extrinsic logic operably coupled to compute a set of output extrinsic Log Likelihood Ratio (LLR) values based upon the set of backward metrics and the set of forward metrics according to an equation:

$$\Lambda(d_k) = \log\left[\sum_{e:u(e)=d_k=+1} e^{\{A_{k-1}(m') + \Gamma_1(c_k, m', m) + B_k(m)\}}\right] - \log\left[\sum_{e:u(e)=d_k=0} e^{\{A_{k-1}(m') + \Gamma_0(c_k, m', m) + B_k(m)\}}\right];$$

and
output logic operably coupled to output the set of output extrinsic Log Likelihood Ratio (LLR) values.

10. Apparatus according to claim 9, wherein the backward recursive metric logic comprises:
logic for using a sliding window for processing less than the entirety of received digital data elements.

11. Apparatus according to claim 10, wherein the logic for using a sliding window for processing less than the entirety of received digital data elements comprises:
logic for initializing the set of backward recursive metrics with equal probabilities.

12. Apparatus according to claim 10, wherein the logic for using a sliding window for processing less than the entirety of received digital data elements comprises:
logic for initializing the set of backward recursive metrics with the set of forward recursive metrics.

13. An apparatus comprising a digital storage medium having embodied therein a program for controlling a programmable logic device to decode received digital data elements representing source data elements coded according to a turbo coding scheme, the program comprising:
branch metric logic programmed to compute a set of branch metrics for the received digital data elements based upon at least one received digital data element;

forward recursive metric logic programmed to compute a set of forward recursive metrics based upon the set of branch metrics according to an approximation:

$$A_k(m) = \log[\alpha_k(m)] = \max_{m'}\{\Gamma(u_k, c_k, m', m) + A_{k-1}(m')\} - H_{A_k};$$

backward recursive metric logic programmed to compute a set of backward recursive metrics based upon the set of branch metrics according to an approximation:

$$B_k(m') = \log[\beta_k(m')] = \max_{m}\{\Gamma(u_k, c_k, m', m) + B_{k+1}(m)\} - H_{B_k};$$

extrinsic logic programmed to compute a set of output extrinsic Log Likelihood Ratio (LLR) values based upon the set of backward metrics and the set of forward metrics according to an equation:

$$\Lambda(d_k) = \log\left[\sum_{e:u(e)=d_k=+1} e^{\{A_{k-1}(m') + \Gamma_1(c_k, m', m) + B_k(m)\}}\right] - \log\left[\sum_{e:u(e)=d_k=0} e^{\{A_{k-1}(m') + \Gamma_0(c_k, m', m) + B_k(m)\}}\right];$$

and
output logic programmed to output the set of output extrinsic Log Likelihood Ratio (LLR) values.

14. The apparatus of claim 13, wherein the programmable logic device comprises one of:
a microprocessor;
a digital signal processor; and
a field programmable gate array.

15. The apparatus of claim 13, wherein the backward recursive metric logic comprises:
logic for using a sliding window for processing less than the entirety of received digital data elements.

16. The apparatus of claim 15, wherein the logic for using a sliding window for processing less than the entirety of received digital data elements comprises:
logic for initializing the set of backward recursive metrics with equal probabilities.

17. The apparatus of claim 15, wherein the logic for using a sliding window for processing less than the entirety of received digital data elements comprises:
logic for initializing the set of backward recursive metrics with the set of forward recursive metrics.

* * * * *